United States Patent [19]

Gibbons

[11] 4,001,864
[45] Jan. 4, 1977

[54] SEMICONDUCTOR P-N JUNCTION SOLAR CELL AND METHOD OF MANUFACTURE

[76] Inventor: James F. Gibbons, 320 Tennyson Ave., Palo Alto, Calif. 94301

[22] Filed: Jan. 30, 1976

[21] Appl. No.: 653,761

[52] U.S. Cl. .................................. 357/30; 357/15; 357/90
[51] Int. Cl.² ......................................... H01L 27/14
[58] Field of Search ...................... 357/30, 15, 90

[56] References Cited
UNITED STATES PATENTS

| | | | |
|---|---|---|---|
| 3,513,040 | 5/1970 | Kaye | 148/178 |
| 3,538,401 | 11/1970 | Chu | 317/235 |
| 3,761,711 | 9/1973 | Hall | 250/370 |
| 3,777,227 | 12/1973 | Krishna | 317/235 R |
| 3,798,079 | 3/1974 | Chu | 148/33.5 |

*Primary Examiner*—Martin H. Edlow

[57] ABSTRACT

There is described efficient semiconductor p-n junction solar cells which can be made from defect-rich semiconductor material. The solar cells include an extended electric field surrounding the p-n junction for extracting the photo-generated carriers in the presence of defects which would otherwise reduce the efficiency of the cell. There is also described a method of fabricating efficient semiconductor p-n junction solar cells.

14 Claims, 17 Drawing Figures

SEMICONDUCTOR P-N JUNCTION SOLAR CELL AND METHOD OF MANUFACTURE

BACKGROUND OF THE INVENTION

This invention relates generally to semiconductor p-n junction solar cells and more particularly to semiconductor p-n junction solar cells having an electric field which extends into the semiconductor body for extracting carriers which are photogenerated within the body by the solar energy impinging upon the cell.

The advantages of the present invention will be more clearly understood when they are compared to a conventional prior art solar cell such as shown in FIG. 1. For purposes of discussion the cell is assumed to be a silicon $n^+p$ junction solar cell.

Conventional solar cells are generally constructed from a p-type wafer of silicon having resistivity in the range 0.5–5Ω-cm and thickness of approximately 200 $\mu$m. Special techniques are employed in the preparation of the silicon wafer so as to maintain a minority carrier lifetime in the range of 10–100 $\mu$s.

Using techniques well known to those skilled in the art a $n^+p$ junction is then formed near one surface of the wafer. For example, an $n^+$ layer is formed by solid state diffusion, so as to create an $n^+p$ junction between the $n^+$ layer and the p-type cell body. In state-of-the-art cells, the $n^+p$ junction is located at a depth of approximately 2000 Å beneath the surface which receives the radiant energy.

An ohmic electrical contact is made to the bottom of the cell. The contact may be made by coating the bottom with an appropriate metal (e.g., aluminum or a thin layer of titanium followed by a layer of gold). A similar metal electrical contact is formed on the top of the cell, except that for the top a special pattern of contact fingers and an antireflection coating, as shown in FIG. 1, are generally employed so that the incident light can be transmitted efficiently into the body of the cell. An alloying step may also be used to reduce the contact resistance between the metal layers and the cell.

Photons of light energy from the sun enter the cell at the top and are absorbed as they pass into the body of the cell. Absorption of this light is accompanied by the creation of electron-hole pairs at various depths within the semiconductor, as shown in FIG. 2. These electrons and holes are then free to diffuse toward the contacts of the cell. As will be explained in more detail later, any given photogenerated carrier can, on average, only travel a distance L (called the diffusion length) away from the depth at which it is created before it either recombines with a carrier of opposite polarity or is trapped at a defect in the semiconductor lattice.

In order to extract electrical power from the cell, it is necessary to separate these diffusing carriers before they recombine or become trapped and supply them to a load connected between the top and bottom contacts. More precisely, the output power which can be developed by the cell shown in FIGS. 1 and 2 will be determined by the number of photogenerated electrons which can be collected into the $n^+$ layer. The mechanisms of electron transport across the body of the cell and electron collection across the $n^+p$ junction into the $n^+$ layer are therefore of fundamental importance to the operation of the cell.

As just mentioned, the mechanism of electron transport in the body of a conventional cell is diffusion. Thus, any electron that is generated within a diffusion length L of the $n^+p$ metallurgical junction can be transported to this junction before it recombines with a hole or becomes trapped at a defect site in the cell body. Collection of these electrons across the $n^+p$ junction into the $n^+$ layer is then accomplished through the action of the built-in electric field which surrounds the metallurgical $n^+p$ junction.

To explain this collection mechanism, we show in FIG. 3 an expanded view of the $n^+p$ junction, in which a space charge layer is shown on the two sides of the metallurgical junction. The space charge layer is a region surrounding the metallurgical junction in which a dipole charge layer develops in the course of fabrication of the $n^+p$ junction. The doping impurities which must be introduced into the silicon to obtain p-type conductivity in the cell body will be negative in the space charge layer, while those that produce n-type conductivity will be positive in the space charge layer. These charges are shown in FIG. 3 with circles around them to indicate that they are bound into the lattice. They are not free to move; the electrons and holes generated in the cell body are free to move.

As a result of these bound charges, electric forces (or fields) are developed within the space charge layer. As indicated in FIG. 3, the direction of the electric force will be such as to attract electrons, which are negative, toward the bound positive charges on one side of the space charge layer. Holes will be attracted toward the bound negative charge on the other side. Hence, any electron which diffuses into the space charge layer from the p-type body of the cell will be pulled across the space charge layer into the $n^+$ layer by the electric force that already exists in the space charge layer. At the same time, holes which diffuse from the p-type cell body into the space charge layer will be pushed back into the body of the cell. The electric field in the space charge layer thereof provides the mechanism for separating electrons and holes which reach the space charge layer by diffusion. This separation of electrons and holes which occurs at the pn junction is responsible for the production of electric current, and therefore electric power, in the cell.

Because the electric field produced in the space charge layer is high, the efficiency with which electrons can be transported across the space charge layer is essentially 100%. Hence, the central problem in making an efficient solar cell is to increase as far as possible the probability that an electron which is photogenerated in the cell body can reach the space charge layer. Stated more precisely, the efficiency of the mechanism by which the electrons are transported from the body of the cell, where they are created, to the edge of the space charge layer, is the major factor which determines the efficiency of a solar cell.

In conventional cells, this transport mechanism is, as mentioned earlier, minority carrier diffusion. From a practical point of view, use of the diffusion mechanism as the means for transporting photogenerated carriers to the $n^+p$ junction implies that the minority carrier lifetime in the silicon material should be as large as possible, so that the electrons that are generated deep in the p-type body can diffuse to the $n^+p$ junction before they either recombine with holes or get trapped at defect sites within the crystal.

To be somewhat more precise, it is shown in the mathematical theory of pn junction diodes, (of which a solar cell is only a special case), that if minority carriers are diffusing in a region where their recombination lifetime is $\tau$, then the average distance they can travel before recombining with a majority carrier is $$L = \sqrt{D\tau} \qquad (1)$$

where L is called the diffusion length, and D is the diffusion coefficient of the diffusing species. The diffusion coefficient D is a basic property of the material, having a value of 35 cm²/sec for electrons in pure silicon at room temperature. The lifetime for a particular type of carrier can also be considered to be a basic material property in that it has an upper limit which can be determined from first principles. A precise analysis of the problem of ultimate solar cell efficiency has been published by Shockley et al., Journal of Applied Physics, Vol. 32, No. 3, pp. 510–519, March 1961, who show that the upper limit on carrier lifetime in silicon is on the order of 1 sec, and, as a result, the theoretical maximum efficiency of a silicon solar cell, of arbitrary construction, is approximately 25%.

However, in actual cases this upper limit on lifetime is rarely (or perhaps never) achieved because carrier lifetimes are extremely sensitive to the material processing techniques that are employed to build the cell. As an example, silicon intended for communication satellite applications is grown and processed in such a way that electron lifetimes on the order of $10 - 100~\mu s$ are achieved, which result in diffusion lengths for electrons of approximately $200 \times 10^{-4}$ cm or greater. Such cells typically have efficiencies on the order of 10–12%.

Efforts to increase this efficiency have been based on the recogition that, due to surface recombination effects, carrier lifetimes at the front and back surfaces of the solar cell can be small even though the carrier lifetime in the body of the cell may be large. Short range drift fields (so-called back-side fields) have been introduced on the bottom surface of present day cells to prevent electrons that are generated near the bottom surface from reaching that surface and recombining. A similar possibility has been suggested for the top surface of the solar cell, but the advantages to be gained from top side fields are not significant in cells that are carefully processed, and as a result, state-of-the-art cells do not currently use surface fields on the top side of the cell. An analysis of the effects of these short range fields is given in Ellis and Moss, Solid State Electronics, Vol. 13, pp. 1–24, Jan. 1970, Pergamon Press and references cited there.

As a practical matter, state-of-the-art cells fabricated using the principles just outlined have efficiencies of 17–19%. However, both the starting materials (i.e., essentially defect-free silicon crystals having very long minority carrier lifetimes) and the processing techniques required to obtain the high efficiency are very costly, so there is substantial interest in and need for a new solar cell design that is capable of producing high-efficiency cells from materials that can be made cheaply such as, for example, silicon ribbon, silicon crystals grown from metallurgical grade material, or even polycrystalline silicon plates.

OBJECTS AND SUMMARY OF THE INVENTION

It is a general object of the present invention to provide a high efficiency semiconductor solar cell and method of manufacture.

It is another object of the present invention to provide an efficient solar cell which can be fabricated from inexpensive semiconductor materials.

It is another object of the present invention to provide an efficient, inexpensive semiconductor solar cell and method of manufacture.

It is a further object of the present invention to provide a solar cell in which the transport of photogenerated carriers in the cell body is primarily by drift fields in the active region of the cell.

It is another object of the present invention to provide a semiconductor solar cell having a collecting junction adjacent to a graded layer whereby fields in the active region of the semiconductor material cause the photogenerated carriers to drift to the collecting junction.

These and other objects of the invention are achieved by a solar cell which comprises a semiconductor body having an active region in which carriers are generated by photons which penetrate into said body, a collector junction for collecting the generated carriers, and a graded layer in said active region adjacent said collecting junction to cause generated carriers to drift to said junction.

DESCRIPTION OF THE PREFERRED EMBODIMENT(s)

Figure 1:
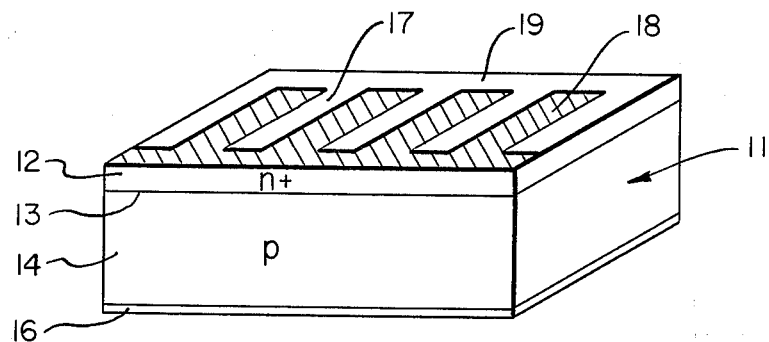
FIG. 1 is a perspective view of a solar cell in accordance with the prior art.
Figure 2:
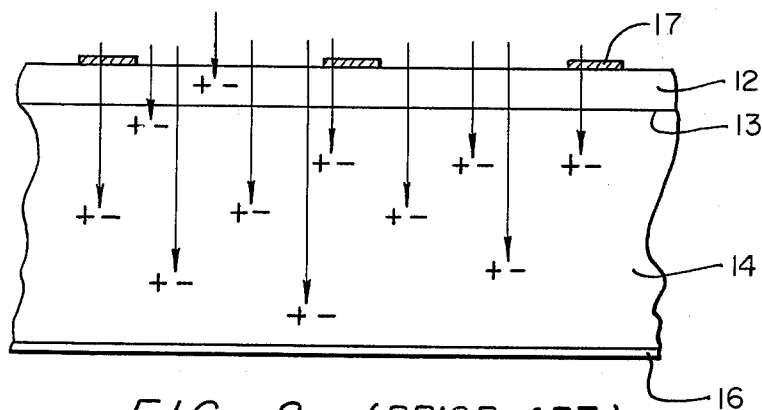
FIG. 2 is an enlarged portion of the solar cell of FIG. 1 showing the generation of hole-election pairs.
Figure 3:
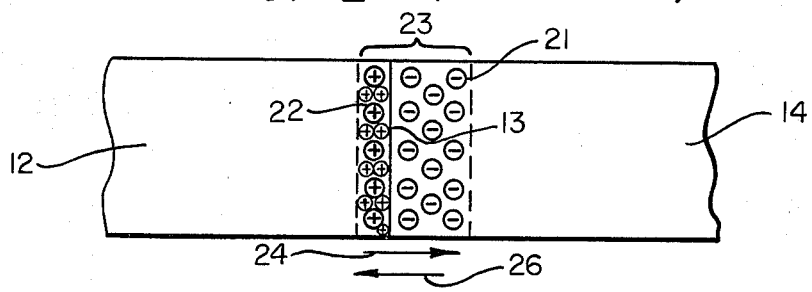
FIG. 3 is an enlarged view of the space charge region in the vicinity of the p-n junction of FIG. 1.

The solar cells in accordance with prior art shown in FIGS. 1, 2 and 3 were briefly described above. Referring particularly to FIG. 1, there is shown a solar cell 11 including an $n^+$ layer 12 forming a junction 13 with a p-type layer 14. The lower surface of the p-type region includes an ohmic contact 16 to which one lead of the solar cell can be connected. The upper surface includes a plurality of conductive fingers 17 making ohmic contact to layer 12. Preferably the exposed regions of layer 12 are provided with an anti-reflective coating 18 shown shaded. The second electric lead is connected to the fingers through the common contact layer 19. As described above and in accordance with the prior art, the material from which the solar cell is made is preferably a high purity material whereby the efficiency of the cell is rather high since there is provided good diffusion of photo-carriers generated in the p-type region in the vicinity of the junction 13 by the solar energy impinging at the upper surface of the cell. In FIG. 2 there is shown an enlarged portion of the solar cell showing how the photons of light energy impinge on the upper surface of the cell to generate holes and electrons within the body which are represented by the plus and minus signs in the vicinity of the arrows which represent the solar energy. Like reference numerals have been applied to like parts in this portion of the solar cell.

FIG. 3 shows the p-n junction with the bound positive and negative charges 21 and 22 generated by n-type and p-type dopant atoms in the space charge layer 23. The arrows 26 and 24 show the direction of force on any electrons and any holes, respectively, which enters the space charge layer.

Figure 4:
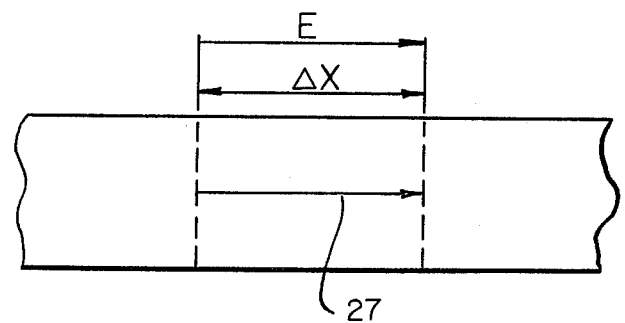
FIG. 4 is useful in understanding the drift and diffusion through a semiconductor region having a built-in electric field.

The present invention will be more clearly understood with reference to FIG. 4 and the description which follows. The region of width $\Delta X$ taken from a bar of semiconductor material as shown in FIG. 4 is used to illustrate diffusion and the drift of carriers across the region $\Delta X$. It is assumed that an electric field E exists across this region. Carriers are transported across the region by both diffusion and drift mechanisms. Diffusion has been described briefly above and will be described in more detail hereinafter.

The velocity $v$ with which carriers drift in an electric field E is, at low electric fields, $$V = \mu E \qquad (2)$$

where $\mu$ is the carrier mobility (a basic material property of the semiconductor). It therefore follows that the time $t_\mu$ required for a carrier to drift a distance $\Delta X$ is $$t_\mu = \frac{\Delta X}{v} = \frac{\Delta X}{\mu E} \qquad (3)$$

Furthermore, if the lifetime of the carrier is $\tau$, then from the principles of statistical mechanics, it can be shown that the probability that the carrier will be able to drift a distance $\Delta X$ before it recombines is $$\text{Prob. of Drifting } \Delta X = -t_\mu/\tau \qquad (4)$$

It therefore follows that, to make the probability of drifting across the region high $$t_\mu <<$$

In particular, $t_\mu = \tau/10$ will give a probability of over 90% that a carrier can drift all the way across a region of width $\Delta X$ before it recombines.

From the theory of diffusion it may similarly be shown that the time required for a carrier to diffuse a distance $\Delta X$ as shown by arrow 27 is $$t_D = \frac{(\Delta X)^2}{2D} \qquad (5)$$

Hence the corresponding probability of diffusing a distance $\Delta X$ before recombining is $$\text{probability of diffusing } \Delta X = e^{-t_D/\tau} \qquad (6)$$

where $\tau$ is again the lifetime of the carrier.

It is well known that well over 99% of the carriers generated by solar light in a silicon solar cell are generated within 50 microns of the cell surface. Reference is therefore made to efficient carrier transport over a 50 micron distance since this is the controlling distance in a solar cell (i.e., $\Delta X$ in the previous analysis = 50 $\mu$m).

If diffusion is the principle mechanism of carrier transport, then the carrier transit time across a 50 $\mu$m portion of the cell body is, from Equation (5), $$t_D = \frac{(\Delta X)^2}{2D} = 3.5 \times 10^{-7} \text{ seconds} \qquad (7)$$

For a 90% probability of transporting the photogenerated carriers a distance of 50 $\mu$m by diffusion the required carrier lifetime is, as indicated above, $$\tau = 10 \ t_D = 3.5 \ \mu s \qquad (8)$$

As a practical matter, the growth and subsequent processing of silicon crystals so as to maintain a carrier lifetime of 3.5 $\mu$s requires state-of-the-art technology and even then is relatively expensive. Fortunately, the required value of $\tau$ can be reduced by employing carrier drift as the transport mechanism.

The electric field required to obtain drift transport in the solar cell is obtained by doping the cell appropriately. To estimate the improvement that can be obtained in this way, we first observe that, from basic physical principles it can be shown that the maximum electric field which can be built into a silicon crystal by doping techniques is $$E \cong \frac{1}{(\Delta X)} \text{ volts/cm} \qquad (9)$$

where ($\Delta X$) is the width of the region in cm. From Equation (3), this value of electric field implies a drift time of $$t_\mu = \frac{\Delta X}{\mu E} = \frac{(\Delta X)^2}{\mu} \qquad (10)$$

Using an average value for $\mu$ of 1000 cm$^2$/ volt-sec in Equation (10) and a cell width $\Delta X$ = 50 microns gives a cell transit time of $$, t_\mu = 2.5 \times 10^{-8} \text{ seconds} \qquad (11)$$

which is about an order of magnitude less than the diffusive transit time. This requires a crystal with carrier lifetime of only $$\tau = 10t = 25 \times 10^{-8} \text{ sec} = 0.25 \ \mu s \qquad (12)$$

to collect 90% of the photogenerated carriers before they recombine. Clearly for this example the carrier lifetime required in the drift cell can be an order of magnitude less than that we would require to fabricate an equally efficient cell in which carrier transport is based solely on diffusion. Furthermore, lifetimes of 0.25 μs can be maintained even in crystals with substantial defects and trapping centers. As a result, in a solar cell employing the drift mechanism in accordance with the invention, the problem of crystal growth and subsequent wafer preparation is simplified, and lower cost techniques can be used for preparation of the semiconductor material from which the solar cell is made for the same efficiency. It is apparent that highly efficient solar cells can be made even in a semiconductor material that is rich in defects if the carrier transport process is aided by the development of internal electric field that extend over a large portion of the active portion of the cell body. The solar cell, in accordance with the invention, is referred to hereinafter as an "extended drift field" solar cell. In accordance with the present invention there are provided extended drift field solar cells which achieve high efficiency even when prepared on material that is rich in defects.

The development of the internal electric field is achieved in the following manner.

It is known that in semiconductors an electric field is produced whenever there is a gradient in the doping density. In particular, if the donor doping $N_d$ is known to vary with $x$ in a manner described formally by $N_d(x)$, then there will be an electric field associated with this density gradient of magnitude $$E(x) = -\frac{kT}{qN_d}\left(\frac{dN_d}{dx}\right) \qquad (13)$$

where the symbols $k$, $T$ and $q$ are Boltzmann's constant, the absolute temperature, and the charge on an electron, respectively.

To illustrate more explicitly the improvements to be obtained by use of the extended drift field concept, we consider the design of a cell in semiconductor material which has a carrier lifetime of $\tau = 1$ μs. We have already shown in Eq (7) that the diffusion transit time is $3.5 \times 10^{-7}$ seconds for a 50 μm thickness of such material. The probability of transporting photogenerated carriers across this 50 μm layer is then, from Eq (6), $$\text{Transport probability} = e^{-t_D/\tau} = e^{-3.5 \times 10^{-7}/1 \times 10^{-6}} \cong 0.7$$

Such a transport probability is too low for efficient cell operation. To achieve efficient cells one must therefore either increase the carrier lifetime (by using a crystal with $\rho$ 3.5 μs, which is the conventional solution) or reduce the transit time to less than 0.1 μs, which is taught in the present invention.

To achieve the required reduction in transit time we require an electric field of 50 V/cm over the region from $x = 0$ to $x = 50$ μm. Such an electric field will insure that the carrier transit time across this region is less than $\tau/10$ [from Equations (3) and (4)], and therefore the transport probability will be greater than 90%. From this value of E we can determine the corresponding form for $N_d$ from Equation (13). We find, at T = 300° K $$\frac{dN_d}{dx} = -0.2 N_d \qquad (15)$$

the solution of which is $$N_d(x) = Ae^{-0.2x} \qquad (16)$$

where $x$ is in microns and A is the doping density at $x = 0$.

Equation (16) describes the manner in which $N_d(x)$ varies if one desires a constant electric field of 50 V/cm over a total distance of 50 microns.

It will be seen from inspection of Equation (16) that the doping density at the surface of the cell ($x=0$) is $$N_d(x=0) = A$$

This value is preferably large so that low resistance contacts can be made. For example, if $A = 10^{20}/cm^3$ the doping density at $x = 50$ μm is $$N_d(x=50\mu) = 4.5 \times 10^{15}/cm^3.$$

Figure 5:
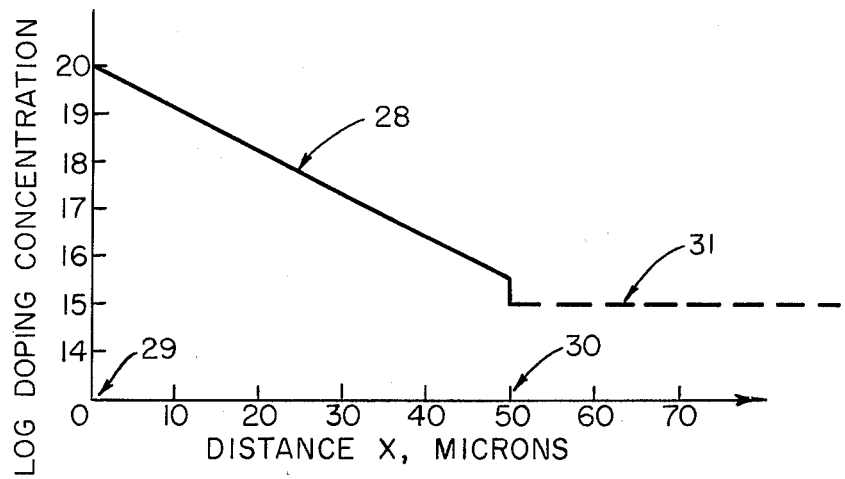
FIG. 5 shows the doping profile in a solar cell in accordance with the present invention.

The donor doping profile which results from these design calculations is shown in FIG. 5. The donor doping is exponentially graded 28 from the surface 29 to a depth of 50 μm, 30, so as to produce a constant electric field of 50V/cm from x = 0 to x = 50 μm. At $x = 50$ μm there is a p-type 32 region having a doping concentration of $10^{15}/cm^3$ which represents the substrate on which the variable n-type doping layer has been fabricated. Various means for obtaining this and other desirable forms of doping profiles for the development of extended electric fields in the body of the solar cell will now be described to elaborate some of the forms which this invention may take. In general, each of these forms provides for an electric field extending over the active region of a solar cell to provide a substantially more efficient cell than one based on diffusive carrier transport.

There follows a description of a number of examples of solar cells in accordance with the teachings of the present invention. The first example assumes a crystal of p-type silicon having a resistivity of 1 Ω-cm and a carrier lifetime of 0.5 μs. The teaching of this invention shows that an average electric field of 50 V/cm developed from the surface to a depth of 50 μm will collect 90% of the carriers generated by solar light.

Figure 6A:
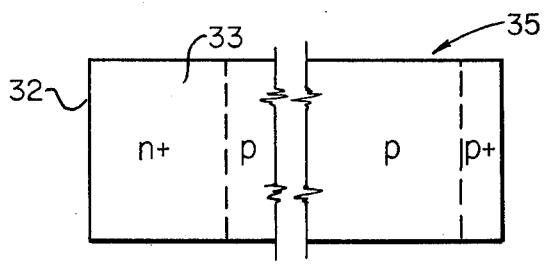
FIGS. 6(a) and 6(b) show a solar cell in accordance with the invention and its impurity profile.
Figure 6B:
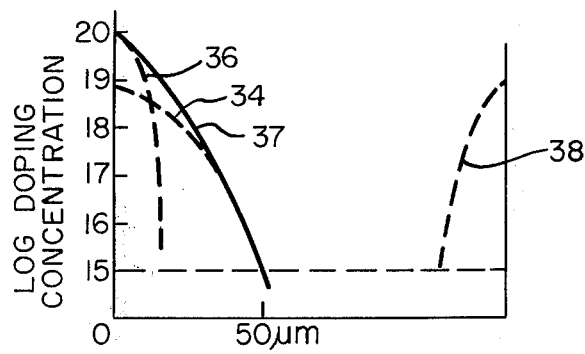

Referring to FIG. 6(a) there is shown a p-type cell 35 with surface 32. The region 33 extends into the cell and includes the extended drift field described above. The impurity profile for the cell is shown in FIG. 6(b). The actual substrate thickness is not critical, though it should be kept as small as practical to minimize the series resistance of the cell.

The extended field can be obtained by solid state high temperature diffusion. For example, it is known that at a temperature of 1300° C phosphorous diffuses into silicon with a diffusion coefficient of 9 (μm)² /(hr). It is also known that with an appropriate flow of POCl₃ gas in a solid state diffusion furnace, a phosphorous surface concentration of $10^{20}/cm^3$ can be maintained during the entire diffusion time, and that the impurity profile for the phosphorous in the silicon crystal will follow approximately a complementary error function. A drift field 37 of approximately 50 V/cm can be developed from the surface to a depth of 50 microns by allowing the solid state diffusion 34 described above to proceed for a period of approximately seven hours. A subsequent shallow phosphorous diffusion 36 can be employed to increase the electric field in regions where the slope of the complementary error function is too small to produce sufficient electric field 37. Furthermore, by observing appropriate precautions, in heating and cooling the material, the carrier lifetime can be maintained at 0.5 $\mu$s A $p^+$ diffusion 38 may also be performed on the back side of the cell to simplify the fabrication of the low resistance contacts to the back side of the cell.

Naturally, other techniques of solid state diffusion, such as proton-enhanced diffusion can be employed to develop an impurity profile of the type illustrated in FIG. 6(b).

Figure 7:
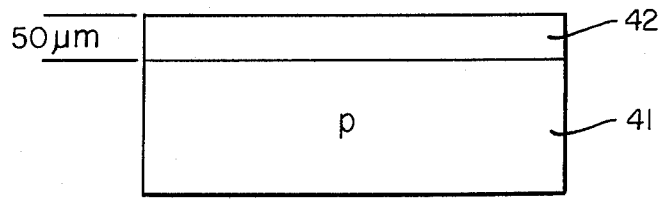
FIG. 7 shows a solar cell including an epitaxial layer with drift field.

It has been shown that the minimum time required for carriers to drift across a 50 micron region is approximately 0.250 $\mu$s. As a result, if the carrier lifetime in the substrate is of this order (or less), the fabrication of a highly efficient solar cell directly in the substrate material will be difficult. One technique for combating this problem is shown in FIG. 7. Here the low lifetime p-type substrate 41 is used as the base on which a doped epitaxial n-type layer 42 is grown. By increasing the density of dopant atoms in the stream of reacting gases with time in an appropriate way, a 50 $\mu$m film can be grown with a doping gradient such as that shown in FIG. 5.

Of course it is possible that defects which produce low lifetime in the substrate will diffuse into the growing film to reduce the lifetime. However, this problem can be minimized by growing the film at relatively low temperatures, since conditions can be found where the film growth rate substantially exceeds the rate at which unwanted substrate impurities diffuse into the film. Epitaxial growth of the doped layer will also be useful if the low substrate lifetime is due to crystalline defects such as stacking faults and dislocation loops, since it is known that under proper conditions these defects do not propagate into the growing film as fast as the film grows. Unwanted impurities and crystalline defects in the substrate can also be reduced prior to the epitaxial growth by gettering techniques well known to those skilled in the art.

As mentioned, well over 99% of the electrons and holes generated in a silicon crystal by solar light are generated within 50 microns of the cell surface. Calculations also show that approximately 80% of the electrons and holes are generated within the first 15 microns of the cell surface. Hence, it should be possible to make extended drift field solar cells with 15 micron-thick epitaxial layers having the extended field that would have an ultimate efficiency of approximately 20% (i.e., 80% of the ultimate efficiency of 25% calculated by Shockley assuming all photogenerated carriers are collected). This is of interest because: (1) for large volume applications it is important to minimize the amount of high quality silicon that is used, and (2) a very short carrier lifetime, on the order of only 20 ns, can be tolerated in the epitaxial film if the cell is properly designed.

The construction of such a cell is illustrated in FIGS. 8a through 8e. We begin with a defect-rich substrate 46 which has an arbitrary p-type doping level, and may also have a variety of normally deleterious impurities (e.g. copper and iron) such as might be found in a crystal grown from impure starting materials; or the crystal may have a variety of structural defects such as stacking faults and grain boundaries.

Figure 8A:
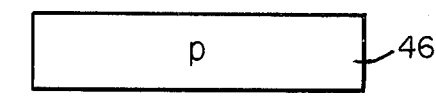
FIGS. 8(a) through 8(f) show the steps of fabricating a solar cell in low purity material and the resulting impurity profile.
Figure 8B:
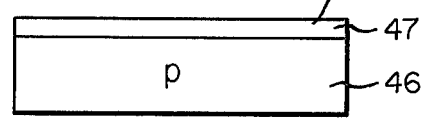
Figure 8C:
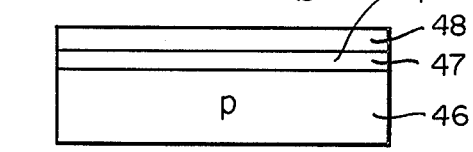

The first step in producing an extended drift field solar cell on such a substrate is to perform a high concentration thermal pre-deposition (or high dose ion implantation) of p-type impurities into the surface of the substrate, as shown at 47, FIG. 8b. An undoped epitaxial layer 48 is then grown on the heavily doped substrate surface, FIG. 8c. Next a high concentration pre-deposition 49 (or high dose ion implantation) of n-type impurities is introduced into the surface of the epitaxial layer, FIG. 8d, after which a standard solid state diffusion is performed to redistribute both the p and n-type pre-deposited impurities. The result of these processes is illustrated schematically in FIG. 8e where the junction is shown at 51. For this cell the simultaneous diffusion of n and p-type impurities through the epitaxial layer produces a cell in which the doping density can be graded continuously from a level of approximately $10^{20}$ donor (n-type) impurities/cm$^3$ at the surface to $10^{20}$ acceptor (p-type) impurities/cm$^3$ at the epi-substrate interface. This continuous grading from $n^+$ to $p^+$ will produce an electric field of approximately 600 V/cm and a drift transit time across the 15 micron layer of 2.5 ns. The carrier lifetime in the layer need therefore be only 25 ns. to provide 90% transport efficiency. Hence the cell will be minimally sensitive to defects incorporated into the epitaxial layer during any of the processing steps.

Figure 9:
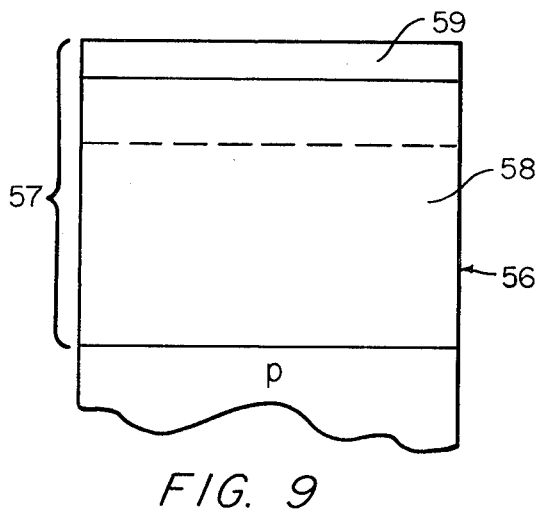
FIG. 9 shows the upper portion of a solar cell constructed in accordance with the present invention.

Extended field solar cells in accordance with the invention were fabricated and tested. The following are examples of cells which were fabricated:

a. A p-type <111> single crystal silicon substrate 56, FIG. 9 having a doping density of $10^{19}$/cm$^3$ and a carrier lifetime of about 100 ns was used as a substrate for growing a 15 micron epitaxial layer. Following this, a high temperature (1200° C) out-diffusion was performed to cause p-type impurities to diffuse from the substrate into the film to a depth of approximately 10 microns 58. This step provided a field of approximately 200 V/cm and a transit time of approximately 5 ns over the region of the epitaxial layer from $x = 5$ microns to $x = 15$ microns (the epi-substrate interface).

A lower temperature diffusion of phosphorous from the surface of the epitaxial layer was then performed at 950° C using a POCl$_3$ gaseous source. The diffusion time was selected to provide an impurity profile 59 that extended from the surface to a depth of approximately 2 microns. The average field along this profile was 500 V/cm and the transit time (from $x = 0$ to $x = 2$ microns) was approximately 0.5 ns. No field was provided for the region from $x = 2$ to $x = 5$, so the cell relies on diffusive transport across this region with transit time of 1.5 ns.

The total cell transit time was therefore 7 ns, and the epitaxial film could therefore have a carrier lifetime that was even less than that in the substrate without deleterious effect on the cell performance.

To complete the cell, titanium gold contacts were evaporated employing the finger pattern illustrate in FIG. 1 for the top contact, and a 750 A coating of Si$_3$N$_4$ was applied for anti-reflection purposes.

The cell had an efficiency in excess of 16%, whereas a control cell made without the long diffusion to provide the field from $x = 5$ $\mu$ to $x = 15$ $\mu$ was found to be only 12% efficient. Hence the teachings of this invention have provided nearly a 50% increase in cell efficiency, and in addition produced a cell that is very close to the best that could be made by any process in a 1.5 micron layer (since the theoretical limit of efficiency for this thickness is only 20%).

b. A silicon ribbon manufactured by the edge-fed growth process was sliced so that the outer portion of the ribbon could be used as a substrate material. This substrate was chosen because the outer portion of such ribbons are known to contain a high density of intersecting growth lines and stacking faults. As a result, carrier lifetimes are low (~25 ns in measured crystals) and the fabrication of efficient solar cells on these materials has proven to be quite difficult, with average cell efficiencies being in the vicinity of 5% (without an antireflective coating). This efficiency was improved by 50%, to a value of 7.5% (without anti-reflective coating) by the following processing to provide extended field in accordance with the invention.

First, for control purposes, an undoped 10 μm epitaxial layer was grown on the silicon ribbon substrate and a conventional solar cell was fabricated in this layer. The experimental efficiency of this cell was 5%, from which we conclude that the carrier lifetime in the epitaxial material is essentially the same as that in the substrate, namely 25 ns.

Figure 8D:
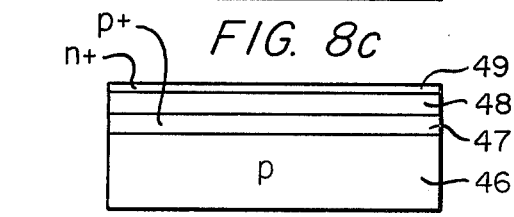
Figure 8E:
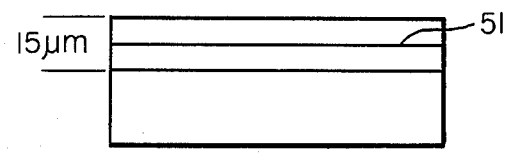

Second, an extended drift field cell was constructed. First, a high concentration boron diffusion 61 was performed on the silicon ribbon substrate 62 to obtain the result given in FIG. 8b. Next an undoped 10 micron epitaxial layer 63 was grown at low temperature. A high temperature (1200° C) diffusion was then performed for a period of 2 hours to redistribute the boron into the epitaxial layer. Under these conditions, the boron distribution extends from the substrate into the film to a distance of approximately 6 microns 64, and generates an electric field of approximately 200 V/cm over this region. Following this, a high concentration phosphorous pre-deposition was employed to produce an n⁺ surface layer such as shown in FIG. 8d, and a proton-enhanced diffusion was then employed to redistribute this phosphorous so that it was approximately exponentially graded to a depth of 1.5 microns 66. The average field produced by this operation is E = 500 V/cm from the surface to a depth of approximately 1.5 μm. Hence substantial electric fields extend over all but 2.5 microns 67 of the epitaxial film, and the total transit time will be dominated by field-aided transport. Further extension of the fields could easily be achieved by increasing the time and energy of the proton bombardment so that the n-type impurity was distributed over 4μ.

Figure 10:
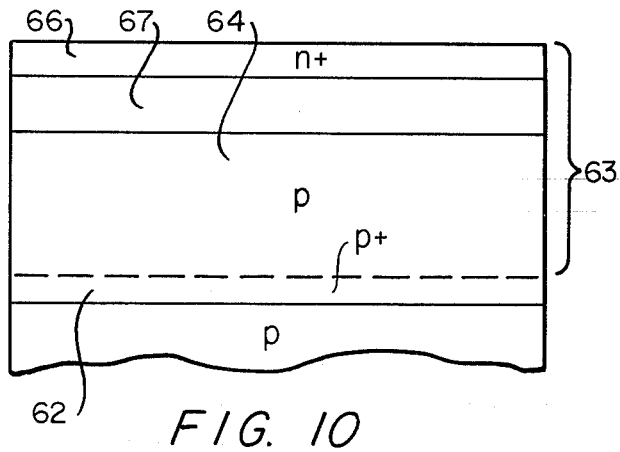
FIG. 10 shows the upper portion of a solar cell constructed on a silicon ribbon substrate.

However, even for the cell constructed, the extended field concept provided a 50% improvement in cell efficiency. The data enable one to show the improvement in efficiency is very close to the value to be expected from the principles presented earlier. To show this the cell is considered to be composed of three regions. Two of these regions have electric fields for efficient carrier transport, while the central region (2.5 μ wide) relies on diffusion transport. The transit times for the regions labeled 66, 67 and 64 in FIG. 10 are, respectively,

| | | | | | |
|---|---|---|---|---|---|
| $t_{66} \cong 0.3$ | × 10⁻⁹ sec | 0 | <x< | 1.5 μ |
| $t_{67} \cong 0.625$ | × 10⁻⁹ sec | 1.5 μ | <x< | 4 μ |
| $t_{64} \cong 6$ | × 10⁻⁹ sec | 4 μ | <x< | 10 μ | for a total transit time of approximately 8 ns.

Since the carrier lifetime in the film is known to be the same as that in the substrate, we expect a transport efficiency across the entire epitaxial layer of [from Equation (4)]

$$e^{-8/25} \cong 0.7$$

It can be shown that an ideal solar cell with no antireflecting coating can have an absolute maximum efficiency of 12%. Hence, allowing for a transport efficiency of 0.7, we should expect a maximum cell efficiency of 8.4% which is very well approximated by the actual value of 7.5%. Since the control cell (with epitaxial layer but no extended drift fields) was found to have an efficiency of only 5%, a 50% improvement in efficiency has been obtained by constructing a cell in which carrier transport is dominated by drift instead of diffusion.

Figure 11:
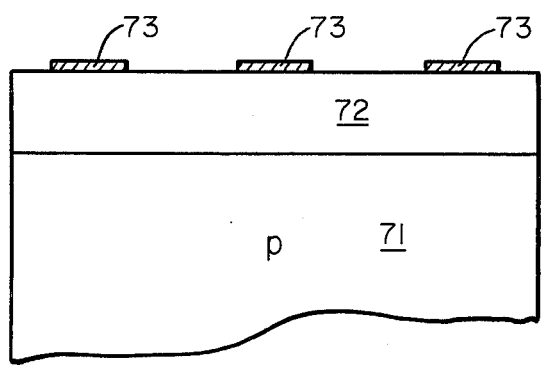
FIG. 11 shows the upper portion of a solar cell in accordance with the invention employing a Schottky Barrier.
Figure 8F:
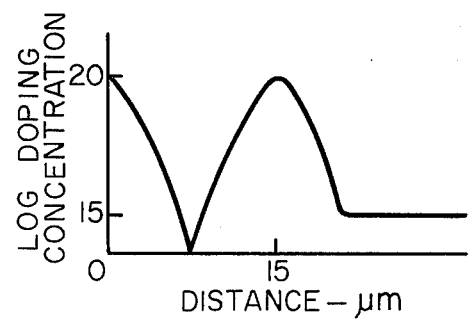

FIG. 11 shows a solar cell employing a Schottky barrier collector. The cell includes a substrate 71 onto which is grown an epitaxial layer 72. A gradient may be provided in the layer 72 during growth as described or by out-diffusion. Carriers generated in the layer 72 drift to the Schottky collectors 73 under the influence of the built-in drift fields.

In the preceding discussion reference has been made to p-type substrates. This type of substrate is preferable because electrons have a larger mobility and therefore exhibit shorter transit time in a given field. However, it is apparent to one skilled in the art that the starting substrate may be n-type and the collector formed by the formation of layers which form a collecting junction. Also reference has been made throughout the discussion to silicon semiconductor material. The present invention is applicable to solar cells formed of other materials. The important feature of the present invention is to provide built-in extended drift fields in the vicinity of the collecting junction and in the active region of the cell so that drift predominates diffusion as the mechanism which brings the photogenerated carriers to the collecting junction.

What is claimed is:

1. A solar cell formed of semiconductor material, said cell including an active region where carriers are generated by solar energy which impinges onto and penetrates the cell, means of forming a collecting junction in said cell cooperating with said active region to collect carriers generated in the active region of the cell, said cell including a portion which has a graded impurity concentration which extends over a substantial portion of said active region to form a built-in electric field whereby carriers generated in the graded portion of said active region are transported to said collecting junction primarily by drift in the electric field.

2. A solar cell as in claim 1 in which said collecting junction is a p-n junction.

3. A solar cell as in claim 1 in which said collecting junction is a Schottky barrier.

4. A solar cell as in claim 1 in which said collecting junction comprises a p-n junction and the impurity concentration in the active region on both sides of the junction includes graded portions to form extended drift fields on each side of the junction.

5. A solar cell as in claim 1 wherein graded impurity concentration is formed by diffusion techniques.

6. A solar cell as in claim 1 in which the active region is formed by epitaxial growth with the doping gradient in said epitaxial region.

7. The method of improving the efficiency of a solar cell of the type which includes a collection junction cooperating with an active region which comprises the step of grading the impurity concentration in the active region of the cell on at least one side of the junction to provide an extended drift field which cooperates with the junction.

8. A solar cell formed of semiconductive material, said cell including an active region where carriers are generated by solar energy impinging and penetrating into said cell, means forming a collecting junction in said active region, and means forming at least one extended drift field in the active region of said cell cooperating with said collecting junction whereby carriers generated in said active region are transported to said junction primarily by drift.

9. A solar cell as in claim 8 in which said collecting junction is a p-n junction.

10. A solar cell as in claim 8 in which said collecting junction is a Schottky barrier.

11. A solar cell as in claim 8 in which said cell includes a body of semiconductor material adjacent and supporting the active region.

12. A solar cell as in claim 11 wherein the active region is formed by solid state diffusion into said body.

13. A solar cell as in claim 11 wherein the active region includes epitaxial material grown onto said body.

14. A semiconductor solar cell including a body of semiconductor material supporting an active region, means forming a collection junction cooperating with said active region, and means in said active region forming an extended drift field in said active region which cooperates with said junction to cause carriers generated in said active region to drift to said collecting junction.

* * * * *